US006788533B2

(12) United States Patent
Chen et al.

(10) Patent No.: US 6,788,533 B2
(45) Date of Patent: Sep. 7, 2004

(54) FIXING DEVICE WITHOUT SCREWS

(75) Inventors: Ku-Feng Chen, Taipei (TW); Yu-Lin Chen, Taipei (TW)

(73) Assignee: Quanta Computer, Inc. (TW)

( * ) Notice: Subject to any disclaimer, the term of this patent is extended or adjusted under 35 U.S.C. 154(b) by 145 days.

(21) Appl. No.: 10/038,728

(22) Filed: Jan. 3, 2002

(65) Prior Publication Data

US 2003/0043540 A1 Mar. 6, 2003

(30) Foreign Application Priority Data

Aug. 29, 2001 (TW) ...................................... 90214828 U

(51) Int. Cl.[7] ................................................ G06F 1/20
(52) U.S. Cl. ...................... 361/687; 361/695; 361/707; 454/184; 165/80.3; 165/121
(58) Field of Search ................................ 361/687, 683, 361/684–686, 707, 694–697, 740, 741, 758, 759; 312/223.1, 223.2, 223.3; 454/184; 165/80.3, 121, 126; 62/259.2

(56) References Cited

U.S. PATENT DOCUMENTS

| 5,269,598 | A | * | 12/1993 | Liu ......................... 312/223.2 |
| 5,594,627 | A | * | 1/1997 | Le .............................. 361/801 |
| 5,936,836 | A | * | 8/1999 | Scholder ..................... 361/695 |
| 6,222,725 | B1 | * | 4/2001 | Jo .............................. 361/683 |
| 6,396,690 | B1 | * | 5/2002 | Blatti ......................... 361/690 |
| 6,462,959 | B1 | * | 10/2002 | Fu et al. ..................... 361/801 |

* cited by examiner

*Primary Examiner*—Lisa Lea-Edmonds
(74) *Attorney, Agent, or Firm*—Perkins Coie LLP; Paul L. Hickman; David B. Dort

(57) ABSTRACT

A fixing device is described. The device fixes a fan and a protocol-control-information long card having a tailpiece without using screws or tools. The fan is for radiating heat from a hard disk and the protocol-control-information long card. The device comprises a plastic fan guard and a plastic fixture. The plastic fan guard is for fixing the fan in place, while the plastic fixture clamps the tailpiece of the protocol-control-information long card.

10 Claims, 2 Drawing Sheets

FIXING DEVICE WITHOUT SCREWS

CROSS REFERENCE TO RELATED APPLICATION

The present application claims priority from Taiwan Patent Application No. 90214828, filed Aug. 29, 2001, incorporated herein by reference.

FIELD OF THE INVENTION

The present invention relates to computer equipment. More particularly, it relates to a device for fixing a fan and a protocol-control-information long card.

BACKGROUND OF THE INVENTION

A fan, commonly used in a server or a personal computer, is for radiating heat from a hard disk or other devices in the computer. A protocol-control-information long card, one of the devices in the computer, is also commonly used equipment. Mounting the protocol-control-information long card and the fan in the server or computer requires a lot of tools and screws.

To install the protocol-control-information long card, for example, a standard fixing device is used to clamp the tailpiece of the card to prevent lateral waving of the card. On the other hand, to prevent the card from jiggling, it is often fixed with additional slide tools and joint bolts. As for the fan, it is conventionally fixed on a hood support by using screws. It is very difficult to locate these fixing devices in an installation process. Similarly, removing the protocol-control-information long card and the fan is also troublesome. Therefore, it is desirable to find a fixing device by which the fan and the card can be easily and reliably installed or removed without using screws and tools.

SUMMARY OF THE INVENTION

It is an object of this invention to prevent the damage to a protocol-control-information long card due to vibration, and to simultaneously provide solution for fixing a fan.

To achieve the above or other purpose, the present invention clamps the protocol-control-information long card by using plastic flexibility. The plastic flexibility limits the motion of the tail piece of the protocol-control-information long card, thereby preventing the card from being damaged or even removed when transporting the computer or conducting a vibration test. Moreover, the present invention provides a device for fixing the fan in place, and such invention is easily mounted in a personal computer or server.

Through a plastic hook and a plastic fan guard of the present invention, it is convenient to install or remove the protocol-control-information long card and the fan. Moreover, the present invention reduces the numbers of screws used in the computer.

In another aspect of the present invention, an assembly is provided for fixing a fan and a protocol-control-information long card having a tail piece. The fan is for radiating heat from a hard disk and the protocol-control-information long card. The assembly comprises a plastic fixture for clamping the tail piece of the protocol-control-information long card. The assembly further comprises a plastic fan guard. The plastic fan guard, connected to the plastic fixture, is for fixing the fan.

According to a preferred embodiment of the present invention, the plastic fixture is a plastic clamp. Additionally, the present invention may comprise a first plastic hook, wherein the first plastic hook and the plastic clamp collectively fix the protocol-control-information long card. On the other hand, the plastic fan guard further comprises a cavity. The cavity has two second plastic hooks for fixing the fan into the cavity. Preferably, the plastic fan guard may have a first air port for radiating heat from the protocol-control-information long card. Moreover, the plastic fan guard may have a second air port for radiating heat from a hard disk.

In another aspect of the present invention, a fixing device without screws is provided for fixing a fan and a protocol-control-information long card having a tail piece. The fan is for radiating heat from a hard disk and the protocol-control-information long card. The fixing device comprises a first plastic hook, a plastic fixture and a plastic fan guard. The plastic fixture clamps the tail piece of the protocol-control-information long card, wherein the plastic fixture and the first plastic hook collectively set up the protocol-control-information long card. The plastic fan guard fixing the fan is connected to the plastic fixture and the first plastic hook.

According to a preferred embodiment of the present invention, the plastic fan guard further comprises a cavity having two second plastic hooks for fixing the fan into the cavity. Moreover, the plastic fan guard has a first air port for radiating heat from the protocol-control-information long card. Furthermore, the plastic fan guard has a second air port for radiating heat from a hard disk.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE INVENTION

Figure 1:
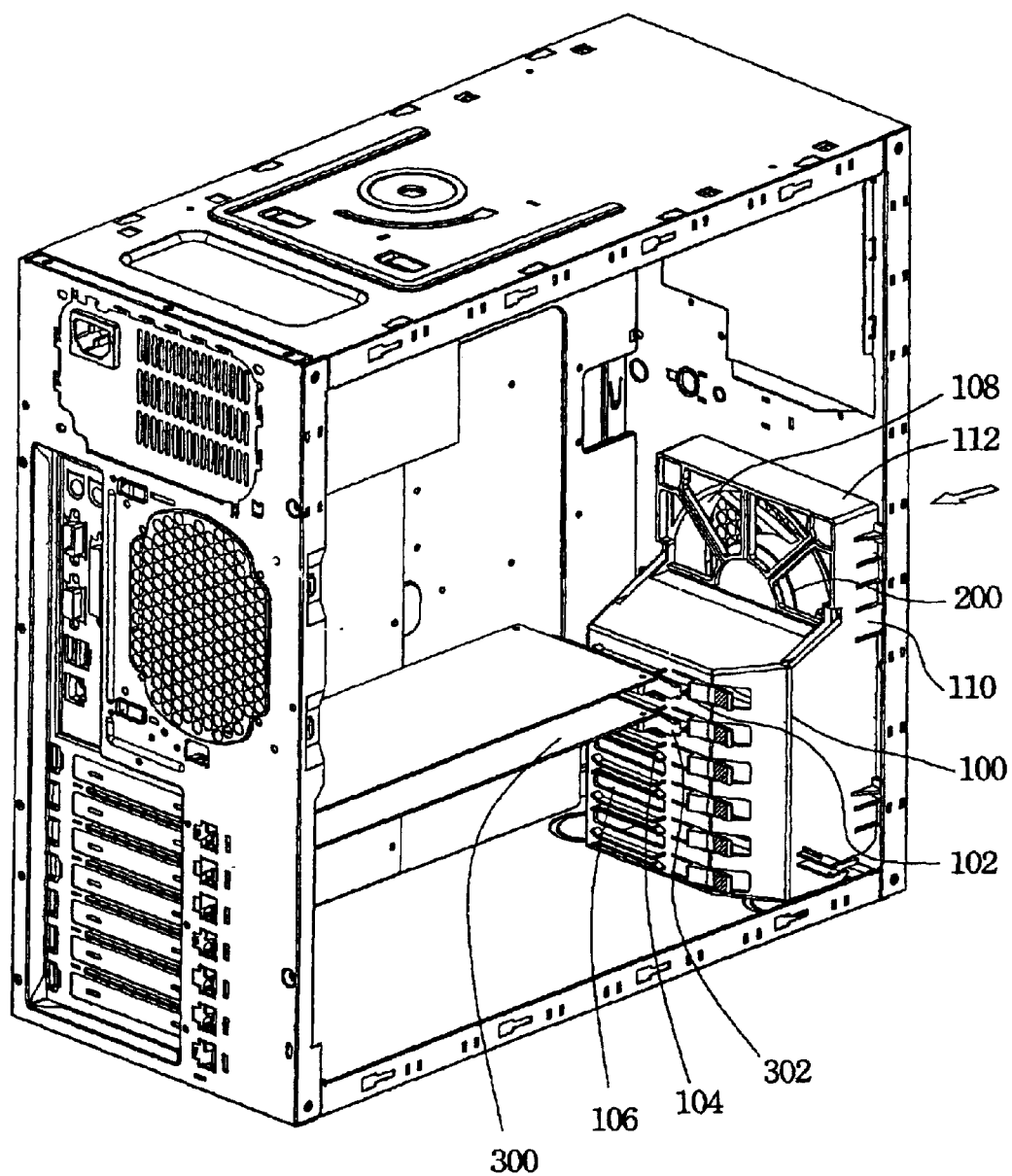
FIG. 1 is a three-dimensional view schematically illustrating a device for fixing a protocol-control-information long card and a fan without using screws.
Figure 3:
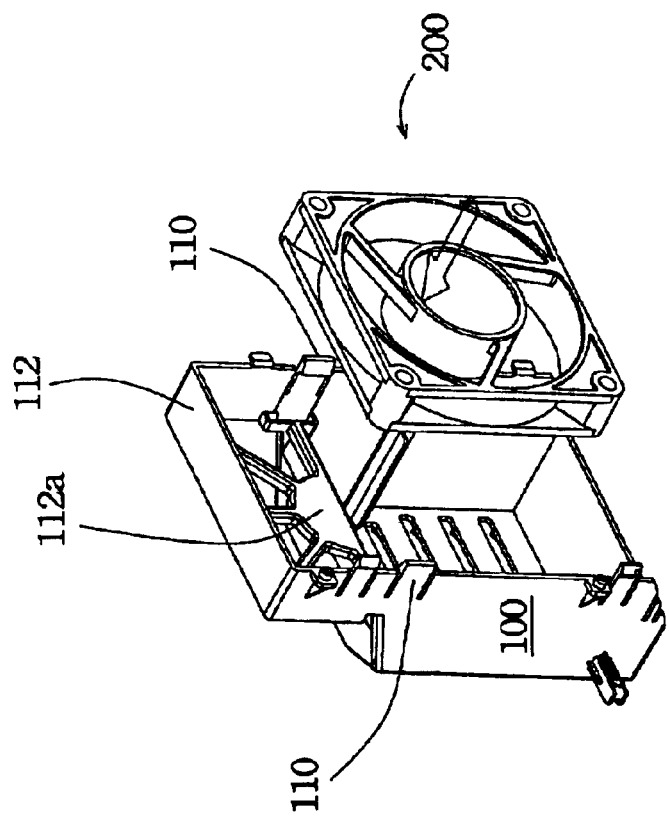
FIG. 3 is a three-dimensional view schematically illustrating a plastic fan guard having a cavity.
Figure 2:
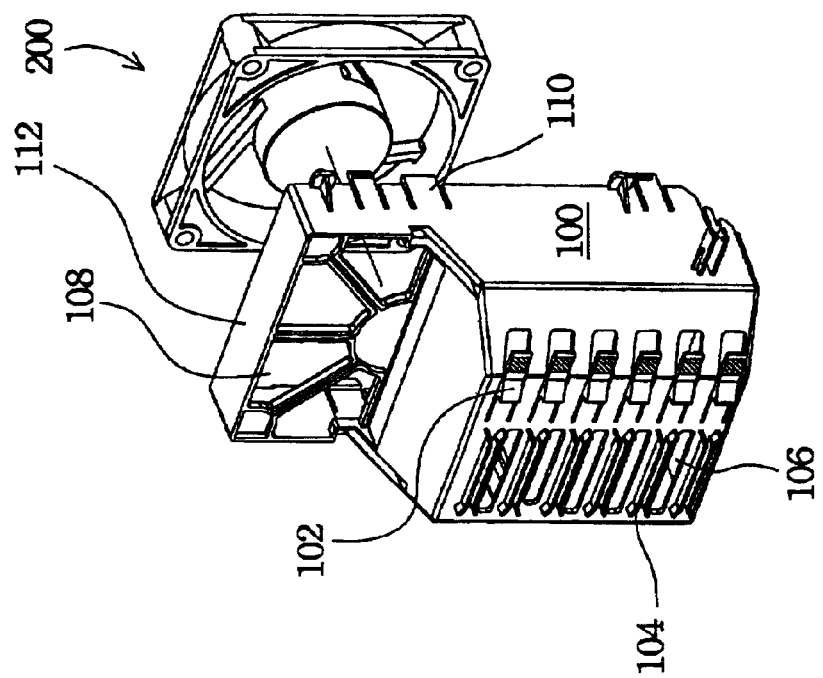
FIG. 2 is a three-dimensional view schematically illustrating a first air port and a second air port of the plastic fan guard.

FIG. 1, FIG. 2 and FIG. 3 are three-dimensional views schematically illustrating a device for fixing in place a protocol-control-information long card and a fan without using screws. Referring to FIG. 1, the present invention comprises a device without screws. The device is for fixing a fan 200 and a protocol-control-information long card 300 having a tail piece 302. The fixing device comprises a first plastic hook 102, a plastic fixture 104 and a plastic fan guard 112. The plastic fixture 112 is for clamping the tail piece 302 of the protocol-control-information long card 300 to prevent the card 300 from laterally waving. Moreover, the plastic fixture 104 and the first plastic hook 102 collectively set up the protocol-control-information long card 300. By its flexibility, the first plastic hook 102 holds the protocol-control-information long card 300 and prevents jiggling thereof. On the other hand, the plastic fan guard 112, connected to the plastic fixture 104 and the first plastic hook 102, is for fixing the fan 200 (FIG. 2 or FIG. 3).

Additionally, referring to FIG. 1 and FIG. 2, the plastic fan guard 112 has a first air port 106 and a second air port 108. About half of the air through the first air port 106 radiates heat from the protocol-control-information long card 300. Another half of the air radiates heat from a hard disk or other devices through a second air port 108. Accordingly, the hard disk and the protocol-control-information long card 300 can be simultaneously cooled by using the plastic fan guard 112.

Referring to FIG. 3, the plastic fan guard further comprises a cavity 112a. The cavity 112a and the plastic fixture 104 (or the first plastic hook 102) are substantially assembled back to back. Moreover, the cavity 112a has two second plastic hooks 110. The two second plastic hooks 110, preferably and substantially identical, are for fixing the fan 200 in the cavity 112a.

The fixing device may have the following points:
1. The plastic hooks fix the fan and the protocol-control-information long card in the computer. In other words, through the plastic hooks, the fan and the protocol-control-information long card can be easily set up in the computer or removed from the computer. More specifically, the first of the plastic hooks is for fixing the fan in place, while the other two second plastic hooks are for fixing the fan into a cavity of a plastic fan guard.
2. Without tools and screws, the fan can be set up or removed by using the second plastic hooks.
3. The plastic fixture, simultaneously molded with the first plastic hook, is for clamping the tailpiece of the protocol-control-information long card to prevent the card from jiggling. On the other hand, the plastic fixture prevents the card from laterally waving. In other words, the first plastic hook and the plastic fixture collectively fix the card in place, thereby preventing the card from being damaged or even removed when the computer is transported or tested for vibration.

The present invention may have advantages as follows:
1. The first plastic hook and the plastic fan guard are simultaneously molded. Through the plastic hook and the plastic fan guard, the protocol-control-information long card and the fan are conveniently installed or removed.
2. The designation of the plastic hooks and the plastic fixture reduces the number of the screws used in the computer.
3. By using the plastic hooks, the fan can be easily set up or removed without any tools.

As is understood by a person skilled in the art, the foregoing preferred embodiments of the present invention are illustrations of the present invention rather than limitations of the present invention. For example, the present invention may fix one or a plurality of protocol-control-information long cards in place. Moreover, mounting no protocol-control-information long card in the computer or sever is still within the sprit of the present invention. In this case, the plastic fixture is merely auxiliary. On the other hand, the shapes of the plastic hook and air port can be designed according to the sizes or specifications of other devices. It is intended to cover various modifications and similar arrangements included within the spirit and scope of the appended claims, the scope of which should be accorded the broadest interpretation so as to encompass all such modifications and similar structure.

What is claimed is:

1. A fixing device without screws, for fixing in place a fan and a protocol-control-information long card having a tall piece, wherein the fan is for radiating heat from a hard disk and the protocol-control-information long card, the fixing device comprising:
   a plastic fan guard having a stepped front surface, at least two sidewalls and a rear cavity, wherein the rear cavity is for receiving the fan;
   a first plastic hook set on the front surface of the plastic fan guard; and
   a plastic fixture set on the front surface of the plastic fan guard, for clamping the tail piece of the protocol-control-information long card, wherein the plastic fixture and the first plastic hook collectively set up the protocol-control-Information long card.

2. The fixing device without screws of claim 1, wherein the plastic fan guard further comprises plastic hooks set on the two sidewalls of the plastic fan guard for fixing the fan into the rear cavity.

3. The fixing device without screws of claim 1, wherein the plastic fan guard has a first air port set on the front surface of the plastic fan guard for radiating heat from the protocol-control-information long card.

4. The fixing device without screws of claim 1 wherein the plastic fan guard has a second air port set on the front surface of the plastic fan guard for radiating heat from the hard disk.

5. A fixing device without screws, for fixing in place a fan and a protocol-control-information long card having a tall piece, wherein the fan is for radiating heat from a hard disk and the protocol-control-information long card, the fixing device comprising:
   a plastic fan guard having a stepped front surface, at least two sidewalls and a rear cavity, wherein the rear cavity is for receiving the fan;
   a first plastic hook set on the front surface of the plastic fan guard;and
   a plastic fixture set on the front surface of the plastic fan guard, for clamping the tail piece of the protocol-control-information long card, wherein the plastic fixture and the first plastic hook collectively set up the protocol-control-Information long card;
   wherein the plastic fan guard has a first air port and a second air port for respectively radiating heat from the protocol-control-information long card and a the hard disk, and plastic fan guard further comprises two second plastic hooks set on the two sidewalls of the plastic fan guard for fixing the fan into the rear cavity.

6. A fixing device without screws, for fixing a fan and a protocol-control-information long card having a tail piece, wherein the fan is for radiating heat from a hard disk and the protocol-control-information long card, the fixing device comprising:
   a plastic fan guard having a stepped front surface at least two sidewalls and rear cavity for fixing the fan; and
   a plastic fixture, for clamping the tailpiece of the protocol-control-information long card, wherein the plastic fixture is set on the front surface of the plastic fan guard, and the rear cavity is for receiving the fan.

7. The fixing device of claim 6, further comprising a first plastic hook, wherein the first plastic hook and the plastic fixture collectively fix the protocol-control-information long card.

8. The fixing device of claim 6, wherein the plastic fan guard has a first air port set on the front surface of the plastic fan guard for radiating heat from the protocol-control-information long card.

9. The fixing device of claim 8, wherein the plastic fan guard has a second air port set on the front surface of the plastic fan guard for radiating heat from a hard disk.

10. The fixing device of claim 6, wherein the plastic fan guard further comprises second plastic hooks set on the two sidewalls of the plastic fan guard for fixing the fan into the cavity.

* * * * *